United States Patent [19]

Chollet et al.

[11] Patent Number: 4,774,406

[45] Date of Patent: Sep. 27, 1988

[54] DEVICE FOR MEASURING AN ELECTRICAL FIELD BY AN OPTICAL METHOD

[75] Inventors: Pierre-Alain Chollet, Clamart; Francois Kajzar, Voisins le Bretonneux; Jean Messier, Gif Sur Yvette, all of France

[73] Assignee: Commisariat a l'Energie Atomique, Paris, France

[21] Appl. No.: 52,996

[22] Filed: May 22, 1987

[30] Foreign Application Priority Data

May 27, 1986 [FR] France .................. 86 07567

[51] Int. Cl.$^4$ ................................ H01J 5/16
[52] U.S. Cl. ............................ 250/227; 250/231 R; 324/96
[58] Field of Search ............... 250/227, 231 R; 324/77 K, 96; 350/96.34

[56] References Cited

U.S. PATENT DOCUMENTS 4,514,860 4/1985 Adolfsson et al. .

FOREIGN PATENT DOCUMENTS 0054292 6/1982 European Pat. Off. .
0095998 12/1983 European Pat. Off. .
0146522 6/1985 European Pat. Off. .
8404439 11/1984 PCT Int'l Appl. .

OTHER PUBLICATIONS

Technisces Messen T.M., vol. 51, No. 6, Jun. 1984, pp. 205-212.

Primary Examiner—Edward P. Westin
Assistant Examiner—Khaled Shami
Attorney, Agent, or Firm—Nutter, McClennen & Fish

[57] ABSTRACT

A device for measuring electric fields mainly comprises a laser and a probe provided with a centrosymmetric polymer sheet permitting the generation, under the action of the field, of the second harmonic of the emitted wavelength. Optical fibers carry the incident and reflected waves of the laser to the probe and then to an optical measuring cascade. This device is of particular interest for measuring the electric fields between high voltage coaxial cables.

9 Claims, 2 Drawing Sheets

DEVICE FOR MEASURING AN ELECTRICAL FIELD BY AN OPTICAL METHOD

BACKGROUND OF THE INVENTION

The present invention relates to a device for measuring the electrical field by a completely optical method.

The presently known processes consist of determining the appearance threshold of electrical discharges between a pair of electrodes immersed in a neutral atmosphere, such as a rare gas. They are not satisfactory, because they involve a complicated realization (formation of a gas confinement enclosure) and make it necessary to introduce a supplementary active or resistive load, which disturbs the characteristic field lines of the phenomenon to be studied.

Thus, the invention proposes establishing the cartography of electrical fields by means of a device including no conductive body in the vicinity of the measuring points.

SUMMARY OF THE INVENTION

It therefore comprises a probe located at the point where it is wished to measure the electrical field and comprising a centrosymmetric polymer sheet, a high power exciting laser emitting a monochromatic pulsation light $\omega$ and a system of optical fibers conducting the light between the laser and the probe, on the one hand, and from the probe to an observation chain of the pulsation light $2\omega$, whose existence signifies the presence of an electrical field in the vicinity of the probe and whose intensity is characteristic of the amplitude of said field on the other hand.

In a preferred embodiment, the centrosymmetric polymer is a polydiacetylene, whose thickness is equal to the coherence length or distance defined hereinafter and which is a function of the polymer and the wavelength of the light emitted by the laser.

BRIEF DESCRIPTION OF THE DRAWINGS

The invention is described in greater detail hereinafter relative to non-limitative embodiments and the attached drawings, in which.

DETAILED DESCRIPTION OF THE EMBODIMENT

Figure 1:
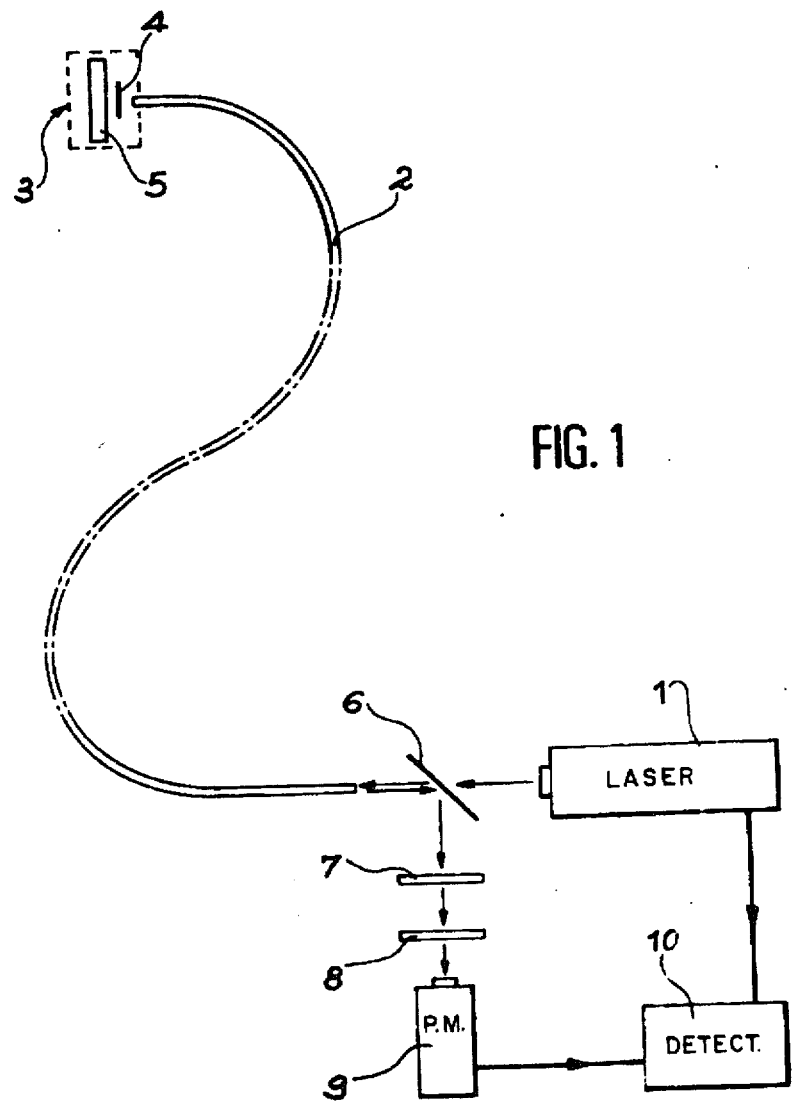
FIGS. 1, 2 and 2A show two possible realizations of the invention, FIG. 2A being an enlargement of FIG. 2.

FIG. 1 shows a YAG-type laser 1, which emits a monochromatic pulsation beam $\omega$ of wavelength $\lambda\omega$ by pulses or surges with a frequency of approximately 1 kilohertz. The surface power emitted is advantageously approximately 1 megawatt per square centimeter. The wave is transmitted by an optical quartz fiber 2 to an electrical field probe 3. The length of optical fiber 2 is conditioned by the need to not disturb the field by the conductive bodies of the apparatus. The attenuation of the optical fibres, less than 1/10 decibel for a length of 10 meters, does not lead to any constraint. Probe 3 is provided with a centrosymmetric polymer sheet 4, such as a blue polydiacetylene with the characteristic chain

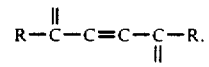

in which R is a molecular group dependent on the polydiacetylene. Due to their centrosymmetric nature, these bodies or materials subject to a light wave cannot generally emit second harmonics of said wave, but only radiation of uneven harmonics of pulsation $\omega$, $3\omega$, etc. Conditions are different when the polymer is immersed in an electric field. Preliminary research carried out by the authors of the invention and summarized in "Electric field induced optical second harmonic generation and polarization effects in polydiacetylene films" (polydiacetylenes, published by D. Bloor and R. R. Chance, NATO ASI Series, Series E: Applied Sciences, No. 102), show that a second harmonic wave emission is then possible.

It is possible to demonstrate that its intensity $I_2$ is proportional to $I\omega^2 E^2/S$, in which $I\omega$ designates the intensity of the light emitted by laser 1 reaching the polymer, E is the electric field to be measured and S the surface of the polymer exposed to the light of the wavelength emitted by laser 1. The inventors have found that the second harmonic light intensity varies as a function of the thickness of polymer sheet 4 on the basis of a sinusoidal function due to the phase displacement between a wave due to the polarization of the polymer and of wavelength $\lambda\omega/2n\omega$ and a wave emitted by the dipoles of the polymer vibrating at pulsation $2\omega$ and wavelength $\lambda\omega/2n_{2\omega}$, in which $n_{2\omega}$ and $n\omega$ are indexes of the polymer at the pulsation waves $2\omega$ and $\omega$. This intensity reaches its maximum when the thickness of the sheet is equal to an uneven multiple of the coherence length or distance $lc = \lambda\omega/4(n_{2\omega} - n\omega)$ and preferably equals said coherence length where the absorption is lowest. In the case of blue polydiacetylene, the authors have revealed the interest of the wavelength $\lambda\omega \geq 1.1\ \mu m$, in which there is no continuous or steady field polarization and more specifically of the length approx 1.3 $\mu m$, where the useful signal is at a maximum and where the absorption by the sheet or the material of the optical fibers is low. These centrosymmetric polymers are advantageously obtained by solvent evaporation.

A wave produced by the passage of light into the polymer and incorporating a high intensity pulsation component $2\omega$ is then, according to this embodiment of the invention, reflected by a mirror 5 disposed in probe 3 in the same optical fiber 2 which ensures the circulation of the incident wave. It is transmitted by means of a splitting plate 6 to a measuring cascade typically constituted by a Schott K63 filter 7, which eliminates the parasitic pulsation component $\omega$, a MTO DA 621C monochromator 8 which isolates the useful pulsation component $2\omega$, a photomultiplier 9 and a photosensitive detector 10 synchronized with laser 1 and which ensures the time integration and the measurement of the collected signals.

Thus, following selection and calibration of the chosen polydiacetylene sheet, able to supply a second harmonic according to an optical resonance phenomenon, this device permits a precise and reliable measurement of the electric fields. The sensor or probe can be very small, the thickness of the polymer sheet being a few microns, so that precise measurements are possible.

Figure 2:
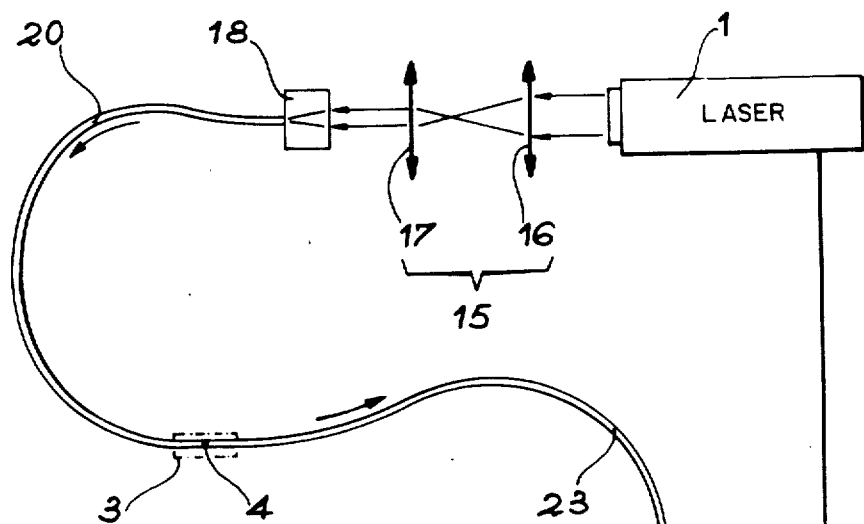
Figure 2A:
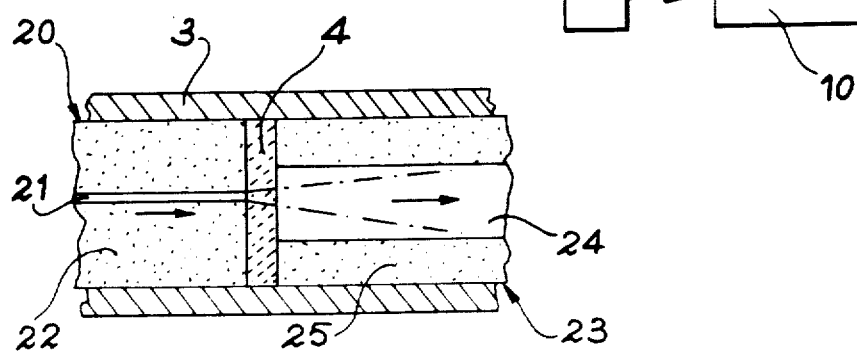

However, the embodiment considered up to now is not the only one which can be envisaged, as can be seen in FIGS. 2 and 3. The elements common to both constructions carry the same references.

The exciting light of wavelength $\lambda\omega = 1.32$ μm is emitted by the YAG laser 1 in the form of a diameter 2 mm beam in accordance with pulsations of frequency 1 kHz for 1 μs and of power 100 W. This diameter is firstly reduced by a telescope 15 formed by two convergent lenses 16, 17, whose spacing is equal to the sum of their focal distances. The beam then reaches a so-called SELFOC lens 18, which introduces it into the core 21 of a monomode optical fiber 20 made from silica.

Core 21 has a diameter of 7 μm and the sheath 22 of the monomode optical fiber 20 has an external diameter of 125 μm. The exciting light is then supplied to the polymer sheet 4, whose thickness, equal to the coherence distance, is in this case approximately 5 μm for a blue polydiacetylene. It then passes into the core 24 of a silica return multimode optical fibre 23 at the same time as the second harmonic light produced by the excitation of polymer sheet 4. The diameter of core 24 is 50 μm and the external diameter of the sheath 25 of multimode optical fiber 23 is 125 μm.

The light leaves the multimode return optical fiber 23 by a second SELFOC lens 26. Analysis can then take place by means of the same equipment as in the preceding construction, namely filter 7, monochromator 8, photomultiplier 9 and photosensitive detector 10.

As the optical fiber 20 and 23 for the arrival and return of the light with respect to polymer sheet 4 differ, it is clearly no longer a question of a mirror 5 in probe 3 and a splitting plate 6. The basis for this different construction will be explained hereinafter.

It is in fact necessary to obtain a second order light intensity which can be measured. The aforementioned formula of $I_{2\omega}$ shows that said intensity can be easily increased by reducing the polymer surface exposed to the incident light, which justifies the use of the monomode fiber 20, whose core 21 has a small diameter. However, a larger diameter is preferable for the core 24 of the return optical fiber 23, in order to collect all the light which has passed into the polymer.

It could well be feared that optical fiber, whereof part is immersed in the electrical field to be measured, would not also produce a second order light component, particularly as the thickness of the polymer is very small (a few microns) compared with the total length of the optical fiber (several meters).

However, as has been seen, the second harmonic light emission is a phenomenon which is not proportional to the length traversed. Moreover, as the second order light intensity to $I_{2\omega}$ is also proportional to $[\chi lc (\sin \pi d/2lc)]^2$, in which d is the length of the path covered by the light in the material and $\chi$ is a susceptibility coefficient of said material, it is possible to demonstrate that, even in the case where the length of the optical fibers would permit maximum emission, said emission would be negligible compared with that of the polymer.

For an exciting wavelength of close to 1.3 μm, the susceptibilities of the polydiacetylene and silica are respectively $10^{-18}$ and $4.10^{-22}$ m$^2$/V$^2$ and their coherence lengths are 5 and 34 μm. The ratio of the order two light intensities consequently exceeds $1.3 \cdot 10^5$, which means that the optical fibers make a negligible contribution.

Obviously the numerical values here are only given for illustration purposes and are not indispensable for a correct realization of the invention and must consequently not be restrictively interpreted.

In all cases, a sensor or transducer without a conductive part is obtained, which does not consequently disturb the phenomenon to be measured, which has a very small size and whose response is very fast (approximately 1 picosecond) and which is in fact limited by the electronics of the observation chain.

One important use for the invention could be the measurement of electric fields in the vicinity of coaxial high voltage cables.

What is claimed is:

1. A device for the optical measurement of an electric field and having a defined coherence length, said device comprising a probe located at the point where it is wished to measure the electric field, a centrosymmetric polymer sheet emitting second order pulsation light when immersed in an electric field and exposed to monochromatic pulsation light a high power exciting laser emitting said monochromatic pulsation light and a system of optical fibers conducting the light between the laser and the probe, on the one hand, and, on the other hand, from the probe to an observation chain for said second order pulsation light whose existence signifies the presence of an electric field in the vicinity of the probe and whose intensity characterizes the amplitude of said field.

2. A measuring device according to claim 1, wherein the centrosymmetric polymer sheet has a thickness equal to an uneven multiple of said coherence length of the device.

3. A measuring device according to claim 1, wherein the centrosymmetric polymer is a polydiacetylene.

4. A measuring device according to claim 3, wherein the polydiacetylene is in blue form.

5. A measuring device according to claim 4, wherein the wavelength of the laser exceeds 1.1 μm.

6. A measuring device according to claim 4, wherein the wavelength of the laser is approximately 1.3 μm in order to obtain said second order pulsation light while obviating an excessive absorption by the sheet or the optical fibers.

7. A measuring device according to claim 1, wherein the optical fibers are made from silica.

8. A measuring device according to claim 1, wherein the system of optical fibers comprises a single optical fiber carrying the light in both directions and wherein the probe comprises a mirror which reflects the light which has passed through the polymer sheet towards said optical fiber.

9. A measuring device according to claim 3, wherein the system of optical fibers comprises a monomode fiber conducting the light between the laser and the probe and a multimode fiber conducting the light from the probe to the observation chain.

* * * * *